Oct. 25, 1960 L. D. ARMSTRONG 2,957,788

ALLOY JUNCTION TYPE SEMICONDUCTOR DEVICES
AND METHODS OF MAKING THEM

Filed Feb. 8, 1955

INVENTOR.
Lorne D. Armstrong
BY J. L. Whittaker
ATTORNEY

United States Patent Office 2,957,788

Patented Oct. 25, 1960

2,957,788

ALLOY JUNCTION TYPE SEMICONDUCTOR DEVICES AND METHODS OF MAKING THEM

Lorne D. Armstrong, Princeton, N.J., assignor to Radio Corporation of America, a corporation of Delaware Filed Feb. 8, 1955, Ser. No. 486,909

6 Claims. (Cl. 148—1.5)

Figure 1:
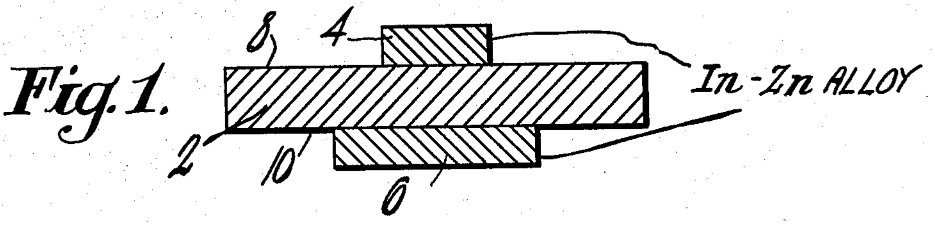

This invention relates to improved semiconductor devices and methods of making them. More particularly, it relates to such devices having improved surface alloyed electrodes comprising alloys of indium with one or both of zinc and cadmium.

Surface alloyed rectifying electrodes used in conjunction with n-type semiconductive germanium and silicon commonly comprise relatively pure indium. Indium is generally preferred for use in the surface alloying process because of its relatively low melting point, its softness and its general ease of handling. It also alloys readily with most known crystalline semiconductors and particularly with germanium and silicon.

It has been found, however, that indium alloys so readily with germanium and silicon that its rate of penetration into the surfaces of the materials is difficult to control. This difficulty is particularly apparent when it is desired to surface alloy two separate indium electrodes upon opposite faces of a thin semiconductor wafer as in the production of an alloy junction triode transistor. In this type of process a large proportion of the devices so made is often spoiled due to improper penetration of the indium either as to depth or as to uniformity over the entire alloy area. Excessive penetration of the two opposite electrodes may create an electrical short-circuit between the electrodes, thus effectively destroying transistor action in the device. Insufficient penetration, although generally less serious, nevertheless adversely affects the current gain and frequency response of the transistors. Non-uniformity tends to produce anomalous results and often increases the reverse saturation currents.

An object of the instant invention is to provide improved semiconductor devices.

Another object is to provide improved methods of making alloy junction semiconductor devices.

Another object is to provide improved surface alloyed electrodes for semiconductor devices.

A further object is to provide improved methods of making p-n-p alloy junction transistors.

Another object is to provide improved methods of making junction type transistors suitable for high frequency uses.

Another object is to provide improved methods of making semiconductor devices which include rectifying barriers of relatively low electrical capacity.

Another object is to provide improved methods of making semiconductor devices having rectifying barriers within relatively thick transition zones between regions of mutually different conductivity characteristics.

These and other objects are accomplished by the instant invention according to which surface alloyed semiconductor devices are made utilizing alloys of indium and one or both of zinc or cadmium as the rectifying electrode material. It has now been discovered that the depth of penetration of an alloyed electrode into semiconductive germanium or silicon may be controlled by utilizing alloys of indium and zinc or cadmium as the electrode materials. An electrode consisting of an alloy according to the invention also alloys more uniformly into the semiconductor surface over its entire contact area than do previous, pure indium electrodes. In addition, during the surface alloy process the zinc or cadmium penetrates by diffusion further into the semiconductor beyond the alloy front than does the indium. Since zinc and cadmium are both acceptor impurities in germanium and silicon the effect of their penetration is to thicken or broaden the transition zone between the n-type material of the semiconductor base and the p-type material which is formed adjacent to the electrode.

Figure 2:
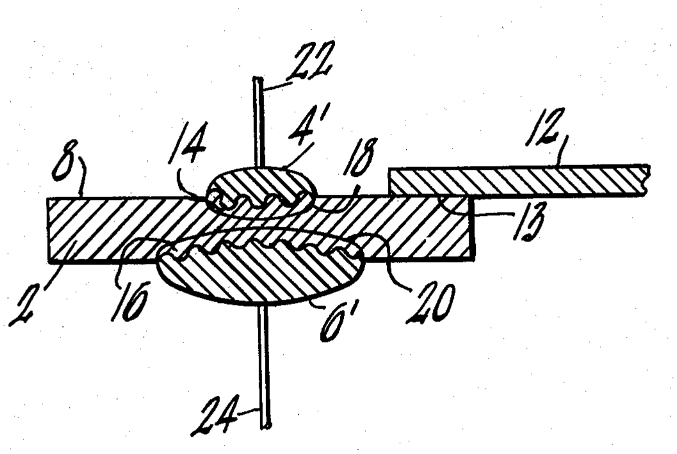

The invention will be described in greater detail in connection with the accompanying drawing of which:

Figure 1 is a schematic, cross-sectional, elevational view of a semiconductor wafer preparatory to a surface alloy process according to the invention; and Figure 2 is a schematic, cross-sectional, elevational view of the semiconductor wafer shown in Figure 1 after it has been formed into a transistor.

Similar reference characters are applied to similar elements throughout the drawing.

In general, the manipulative steps of the instant invention are similar to the manipulative steps previously used in the manufacture of alloy junction triode transistors. According to the instant invention, however, specified materials are selected for use as electrode-forming bodies, and the temperatures utilized in the alloy process may be varied beyond the range heretofore preferred for the commercial production of such transistors.

Referring now to the drawing, a transistor device may be produced according to a preferred embodiment of the invention utilizing a wafer 2 of n-type semiconductive germanium. The wafer preferably has a resistivity of about 0.1 to 5 ohm-cm. and when initially cut from a relatively large single crystal of germanium may be about 0.08" x 0.1" x .01" thick in size. It is etched in any known sizing solution to reduce its thickness to about .005", to remove contaminants from its surface, and to expose a clean, crystallographically undisturbed surface. A typical solution suitable for etching the wafer consists of 10 ml. concentrated hydrofluoric acid, 10 ml. concentrated nitric acid, 0.2 gm. iodine and about 10 ml. water.

The electrode material is prepared by alloying indium with a minor percentage of zinc or cadmium or both, the preferred alloying material being zinc. About 0.1 atomic percent to 40 atomic percent of zinc or cadmium or a mixture of the two is alloyed with indium, i.e., the resulting material consists of 0.1% to 40% zinc, cadmium or a mixture of zinc and cadmium, and 99.9% to 60% indium on an atomic basis. The preferred proportion of indium in the alloy is about 92 atomic percent in the case of zinc and about 75 atomic percent in the case of cadmium. These are approximately the eutectic proportions for the respective systems and permit the greatest variations in processing temperatures.

The alloying of the indium together with the zinc or cadmium is preferably accomplished by melting the two substances together in a vacuum furnace, mixing thoroughly, cooling the melt and then rolling the product into sheet form. When quantities of zinc or cadmium in the upper portion of the range are used, it is also desirable to quench the alloy so that the zinc or the cadmium does not segregate itself to produce a non-uniform alloy.

From a sheet of an indium-zinc alloy thus prepared, discs are punched to form the electrodes 4 and 6. The discs are preferably about .005" thick. One of the discs 4 which forms the electrode 4' may be about .015" in diameter. This electrode may be utilized as an emitter electrode when the transistor is incorporated in a circuit. The other disc 6 may be about .045" in diameter. It forms a relatively large electrode which is preferably utilized in a circuit as a collector electrode. The two discs are placed in coaxial alignment upon opposite surfaces 8 and 10, respectively, of the wafer and held in place by any desired jig means, not shown. In order to minimize contamination of the device during the subsequent heating step the jig should be constructed of an inert refractory material such as carbon or oxidized stainless steel. The ensemble is then heated for about 5 minutes at about 500° C. in a non-oxidizing atmosphere such as dry hydrogen.

After cooling the unit is etched to remove contaminants from its surface. The etching is not critical and may be carried out by any known technique such as by immersion in a concentrated nitric acid-hydrofluoric acid solution or by electrolysis in an alkaline solution. The etching removes contaminants from the surface of the wafer and particularly from that portion of the surface surrounding the electrodes where the peripheries of the rectifying barriers 18 and 20 are exposed.

A base lead 12 is attached to the surface 8 of the wafer by a non-rectifying solder connection 13 and separate electrical lead wires 22 and 24 are connected to the electrodes 4' and 6', respectively. The unit may then be conventionally mounted and potted.

During the alloy process the indium-zinc electrodes dissolve portions of the wafer forming molten pools which penetrate into the wafer towards each other. As the unit is cooled, a portion of the dissolved germanium recrystallizes upon the wafer forming the recrystallized regions 14 and 16. These regions include electrically significant proportions of the electrode materials which impart p-type conductivity to them. If the cooling is carried out at a sufficiently slow rate substantially all of the dissolved germanium is returned to the base and the recrystallized region corresponds closely to the shape of the wafer before the process. If the cooling is carried out at a relatively rapid rate, such as would normally be expected in ordinary practice, only a portion of the germanium recrystallizes upon the base, another portion precipitates as a separate phase in the indium alloy and a relatively small portion dissolves in the alloy.

The surfaces 18 and 20 of maximum penetration of the electrodes into the wafer during the alloy process are referred to as the "alloy fronts." In previous practice using indium alone as an electrode material, very little diffusion of indium into the germanium takes place beyond the alloy front and a rectifying barrier is formed closely adjacent to the alloy front. Utilizing the materials according to the invention, on the other hand, zinc and cadmium diffuse about 5 times more rapidly than does indium in germanium and, therefore, penetrate more deeply into the germanium base, thus forming more gradual transition zones between the p-type recrystallized regions and the n-type material of the base wafer. This more gradual and thicker transition zone is effective in reducing the electrical capacitance of the electrodes and thus improves their efficiency and permits their operation at relatively higher electrical frequencies.

An additional advantage of the practice of the instant invention is an improvement in the uniformity of penetration of the electrode over its entire area of contact with the semiconductor. Although the exact reasons for this improvement are not known it is presently believed to be due primarily to an improvement in wetting of the semiconductor by the electrode in the surface alloy process. It appears likely that the addition of zinc or cadmium to indium lowers its surface tension and thus improves its power to wet the semiconductor. It has been found that uniformity of penetration is highly desirable in order to ensure optimum reverse current characteristics in rectifying barriers made by the surface alloy process.

Although a simple p-n-p transistor has been described in the example it will be apparent that any desired number of rectifying barriers may be formed in the same body of germanium by this method and that these may be arranged in any desired manner. The electrodes according to the invention may be put down upon n-type semiconductive germanium as well as p-type, in which case they form n+n rectifying barriers. The method is intended to be a general one applicable to the formation of rectifying barriers by surface alloying selected impurities into bodies of germanium and silicon. Thus, diode rectifiers including only single rectifying barriers are also included.

Variations may be made in the firing temperatures and times heretofore described. In general, the firing time is not critical. It is, however, preferably sufficiently long to permit the solution of the germanium or silicon into the electrode material to reach equilibrium. Additional time has no effect on the alloy process but does increase the diffusion of the zinc or cadmium into the semiconductor. When the units are fired at temperatures higher than about 700° C. they are preferably fired for times of about 2 to 5 minutes. Otherwise, the diffusion of the zinc or cadmium may extend into an undesirably large portion of the wafer and may even convert the entire wafer to p-type conductivity. At temperatures below 700° C. diffusion is less rapid and the units may be fired for relatively long periods of time without danger of excessive diffusion. Firing cycles of 30 minutes to an hour or more may be utilized.

Many different etching solutions are suitable for treating the germanium or silicon prior to the heating steps and for treating the device after it is formed. These are known and conventional. Typical solutions have been described in connection with the example.

There have thus been described improved semiconductor devices and methods of making them, which devices are especially suited for operation at relatively high electrical frequencies.

What is claimed is:

1. A semiconductor device comprising a body of a semiconductive material selected from the group consisting of germanium and silicon and a metallic electrode alloyed to a surface of said body, said electrode consisting essentially of an alloy of 99.9 to 60 atomic percent indium and 0.1 to 40 atomic percent of at least one metal selected from the group consisting of zinc and cadmium.

2. A semiconductor device comprising a body of a semiconductive material selected from the group consisting of germanium and silicon having two substantially parallel opposite surfaces and two metallic electrodes, one of said metallic electrodes being surface alloyed to one of said surfaces and the other of said electrodes being alloyed to the other of said surfaces, said two electrodes being coaxially aligned and consisting essentially of an alloy of 99.9 to 60 atomic percent indium and 0.1 to 40 atomic percent of at least one metal selected from the group consisting of zinc and cadmium.

3. A device according to claim 2 in which said metal is zinc.

4. Method of making a semiconductor device comprising surface alloying upon a semiconductive germanium body an electrode body composed of 99.9 to 60 atomic percent indium and 0.1 to 40 aotmic percent of at least one metal selected from the group consisting of zinc and cadmium, said surface alloying being carried out by placing said electrode body in contact with a surface of said germanium body and heating both said bodies together in a non-oxidizing atmosphere to a temperature above the melting point of said electrode body but below the melting point of said germanium body.

5. In a transistor device of the type comprising a thin wafer of N-conductivity type semiconductive germanium having coaxially aligned rectifying electrodes on opposite surfaces thereof and a non-rectifying electrode also connected to said wafer, the improvement consisting of said rectifying electrodes having the composition 99.9 to 60 atomic percent indium and 0.1 to 40 atomic percent of at least one metal selected from the group consisting of zinc and cadmium.

6. A method of manufacturing a transistor device of the type including a thin wafer of N-conductivity type semiconducting germanium and rectifying electrodes of the surface alloy type coaxially aligned on opposite surfaces thereof, said method comprising utilizing electrode material composed of 99.9 to 60 atomic percent indium and 0.1 to 40 atomic percent of at least one metal selected from the group consisting of zinc and cadmium, said surface alloying being carried out by placing said electrode bodies in contact with previously etched surfaces of the germanium body and heating the bodies together in a non-oxidizing atmosphere to a temperature above the melting point of said electrode body but below the melting point of said germanium body such that said electrode bodies wet the germanium body substantially uniformly and form P-N rectifying junctions within said germanium body.

References Cited in the file of this patent

UNITED STATES PATENTS

| | | |
|---|---|---|
| 2,428,992 | Ransley | Oct. 14, 1947 |
| 2,569,347 | Shockley | Sept. 25, 1951 |
| 2,644,852 | Dunlap | July 7, 1953 |
| 2,703,855 | Koch | Mar. 8, 1955 |

OTHER REFERENCES

Fuller: Physical Review, vol. 86, May 1, 1952, pp. 136 and 137.